United States Patent

Marie

[11] Patent Number: 5,877,713
[45] Date of Patent: Mar. 2, 1999

[54] DIGITAL PROGRAMMABLE PHASE SHIFTER AND A/D CONVERTER USING SUCH A PHASE SHIFTER

[75] Inventor: Herve Marie, Saint Aubin/Mer, France

[73] Assignee: U.S. Philips Corporation, New York, N.Y.

[21] Appl. No.: 940,597

[22] Filed: Sep. 30, 1997

[30] Foreign Application Priority Data

Oct. 2, 1996 [FR] France ................................. 96 12015

[51] Int. Cl.$^6$ ........................................ H03H 7/18
[52] U.S. Cl. ................................. 341/122; 341/155
[58] Field of Search ............................ 341/122, 111, 341/155, 110, 123, 162

[56] References Cited

FOREIGN PATENT DOCUMENTS 1527603  10/1978  United Kingdom ............. H03H 7/18

*Primary Examiner*—Brian Young
*Attorney, Agent, or Firm*—Peter Verdonk

[57] ABSTRACT

The invention relates to a programmable phase shifter PS receiving an input signal Vin to be phase-shifted, of the form A.cos ωt, a digital control signal CM[0:2N−1], and supplying an output signal Vout of the form A'.cos (ωt−X), the phase shift value X being defined by the control signal CM[0:2N−1], said phase shifter comprising a module 10 supplying a signal in phase quadrature with the input signal Vin of the form A.sin ωt, a first multiplier 20 and a second multiplier 30, the first multiplier 20 supplying a signal resulting from the multiplication of the signal Vin by a value which is substantially equal to V.cos (X), the second multiplier 30 supplying a signal resulting from the multiplication of the output signal of the quadratic module by a value which is substantially equal to V.sin (X), an adder 40 supplying a signal Vout of the form A'.cos (ωt−X) resulting from the sum of the output signals of the multipliers 20 and 30. According to the invention, the control signal CM[0:2N−1] is constituted by two control words C[0:N−1] and S[0:N−1] defining values which are substantially equal to V.cos (X) and V.sin (X), each multiplier 20 and 30 having an input of a digital type receiving one of the control words C[0:N−1] or S[0:N−1], and being provided with means for effecting a digital multiplication.

5 Claims, 3 Drawing Sheets

DIGITAL PROGRAMMABLE PHASE SHIFTER AND A/D CONVERTER USING SUCH A PHASE SHIFTER

BACKGROUND OF THE INVENTION

The invention relates to a programmable phase shifter having a first input intended to receive an input signal to be phase-shifted, a second input intended to receive a control signal, and an output intended to supply an output signal which, with respect to the input signal, has a phase shift of which a value X is defined by the control signal, said programmable phase shifter comprising:

a quadratic module having an input which is connected to the first input of the programmable phase shifter, and an output intended to supply a signal which is in phase quadrature with the input signal, a first and a second multiplier each having a first and a second input and an output, the first input of the first multiplier being connected to the first input of the programmable phase shifter, the first input of the second multiplier being connected to the output of the quadratic module, the output of the first multiplier being intended to supply a signal resulting from the multiplication of the signal received at its first input by a value which is substantially equal to V.cos (X), in which V represents a DC voltage, the output of the second multiplier being intended to supply a signal resulting from the multiplication of the signal received at its first input by a value which is substantially equal to V.sin (X), the values V.cos (X) and V.sin (X) being defined by signals elaborated on the basis of the control signal and received by the multipliers at their second input, an adder having a first input which is connected to the output of the first multiplier, a second input which is connected to the output of the second multiplier and intended to supply, at an output connected to the output of the programmable phase shifter, a signal resulting from the sum of the signals received at its first and second inputs.

Such a programmable phase shifter is known from British patent specification 1 527 603. The phase shifter which is described in this document comprises a potentiometer generating, on the basis of an analog control signal, a first analog voltage having a value which is substantially equal to V.sin (X), and a second analog voltage having a value which is substantially equal to V.cos (X). The input signal which has, for example, the form A.cos ωt, is multiplied within the first multiplier by the signal which this multiplier receives at its second input, i.e. V.cos (X), while a signal which is in phase quadrature with the input signal and is thus expressed by the form A.sin ωt, is multiplied within the second multiplier by the signal which this multiplier receives at its second input, i.e. V.sin (X). The output signal of the adder thus has the form A'.(cos ωt.cos (X)+sin ωt.sin (X)), which corresponds to A'.cos (ωt−X). The value of X, implicitly defined by the control signal, thus determines the phase shift of the output signal with respect to the input signal. Because of the analog nature of the potentiometer, the values of the voltages which it generates on the basis of the control signal may lack precision. The error produced on these voltages, which itself is difficult to control, happens to be multiplied within the multipliers which generate a supplementary error because of their analog nature. These accumulated errors may introduce a significant difference between the desired phase shift and the phase shift actually obtained by means of the programmable phase shifter.

SUMMARY OF THE INVENTION

It is an object of the invention to remedy this drawback to a great extent by proposing a programmable phase shifter in which the operations which are most liable to introduce errors are carried out in a digital form.

To this end, a programmable phase shifter according to the invention is characterized in that, the control signal being constituted by a first control word defining a value which is substantially equal to V.cos (X) and a second control word defining a value which is substantially equal to V.sin (X), the second input of each multiplier is of a digital type and intended to receive one of the control words, and each multiplier is provided with means for multiplying the signal received at its first input by the signal received at its second input.

In such a programmable phase shifter, the contents of the control words assume discrete digital values and inevitably introduce approximation errors, but these errors are perfectly known and controllable. They may be minimized by an appropriate choice of the formats of the control words which will allow a definition which is all the better and thus the approximation errors all the smaller as their format is larger.

An embodiment of the invention is characterized in that the multipliers are digital multipliers. In contrast to analog multipliers, such multipliers do not introduce supplementary errors.

Different embodiments of multipliers are possible as a function of the code used for defining the values of V.cos (X) and V.sin (X) within the control words, and of the sought precision.

A particular embodiment of the invention provides a programmable phase shifter as described hereinbefore, which is characterized in that, the format of the control words being N bits, each multiplier comprises:

a switching stage composed of N−1 switches each having a first and a second terminal and a control input for controlling the switching operation, the first terminal of each switch being connected to the first input of the multiplier, the N−1 control inputs receiving N−1 bits from the second input of the multiplier, an adder having an output and N−1 inputs, each being connected to the second terminal of one of the N−1 switches of the switching stage, and an inversion module having a first input connected to the output of the adder, a control input receiving that bit, referred to as sign bit, from the second input of the multiplier which does not control any switch of the switching stage, and an output constituting the output of the multiplier, said inversion module being intended to operate the inversion of the sign of a signal received at its first input if the sign bit is in an active state, and to function as a follower if the sign bit is in an inactive state.

In such a programmable phase shifter, the digital value of the contents of each control word corresponds to the total number of bits, with the exception of the sign bit, which bits are at an active level and thus allow the switches to be rendered conducting. This coding is advantageous because the values of the control words are mutually complementary, with the exception of the sign bits. The elaboration of the control signal thus happens to be simplified.

A preferred embodiment of the invention allows the reduction of the size of the control words and thus the size of the adders in the multipliers, without affecting the precision of the phase shifter.

An embodiment of such a programmable phase shifter is characterized in that an amplifier stage composed of N−1 amplifiers is inserted within each multiplier, each amplifier having an input which is connected to the first input of the multiplier, and an output whose activation and deactivation are controlled by means of one of the N−1 switches of the switching stage, connected to one of the inputs of the adder, the gain Gi of the $i^{th}$ amplifier (for i=1 to N−1) being equal to K times the weight, within the control word from which it originates, of the bit controlling the switch which controls the activation or deactivation of the output of said $i^{th}$ amplifier.

By attributing a specific weight to each of the bits constituting the control words, such a coding system allows the range of values generated by the combinations of said bits to be extended. The example of the binary code, in which N bits can describe $2^N$ integral values, clearly illustrates this advantage.

A programmable phase shifter according to the invention may be used in any application necessitating a temporal control of a signal. In A/D conversion applications of high-frequency video signals, for example, the signal must be sampled during a time interval in which said signal has a reference threshold. At the high-frequency, this time interval is very short and a temporal control of the signal determining the instant when the reference threshold has to be sampled ensures that this sampling is effected under the required conditions.

The invention thus also relates to an A/D converter intended to receive an analog input voltage to be converted into a digital output signal, comprising:

- a resistance ladder arranged in series between two power supply terminals, which resistances are intended to supply a plurality of reference voltages at their junction points,
- a comparison stage composed of comparators, each having two inputs and one output, and being intended to receive the analog input voltage at one input and one of the reference voltages at the other input,
- a memory stage composed of flipflops, each being connected to the output of one of the comparators for storing the result of a comparison, and intended to receive a sampling signal at a clock input,
- a binary encoder connected to the memory stage for receiving the stored data and for furnishing the digital output signal of the converter,
    characterized in that the converter also comprises a programmable phase shifter as described hereinbefore, intended receive a clock signal having a fixed frequency at its first input, a digital control signal at its second input, and to deliver the sampling signal at its output, which sampling signal, with respect to the clock signal, has a phase shift whose value is defined by the control signal.

These and other aspects of the invention are apparent from and will be elucidated with reference to the embodiments described hereinafter.

DESCRIPTION OF THE PREFERRED EMBODIMENTS

Figure 1:
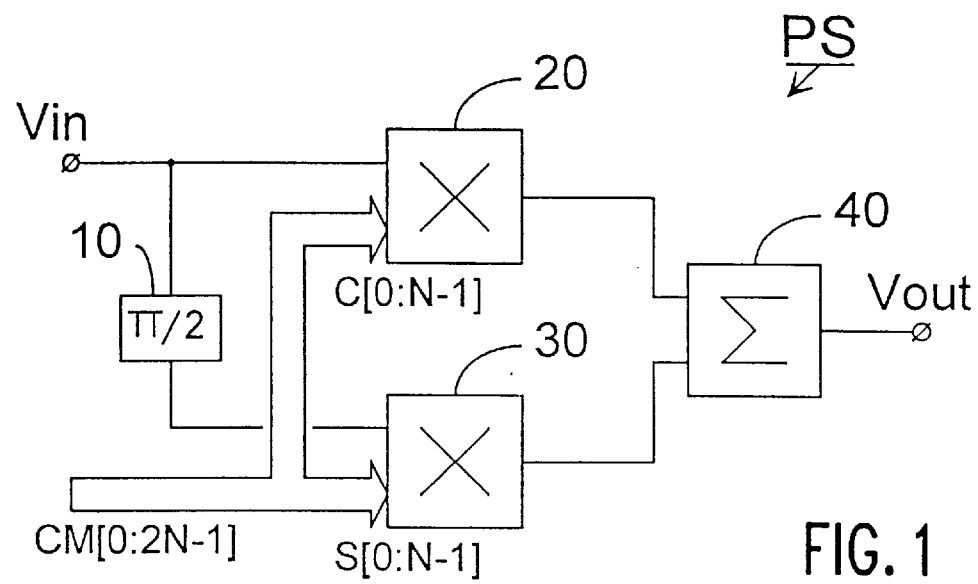
FIG. 1 is a block diagram partly showing a programmable phase shifter according to the invention.

FIG. 1 shows diagrammatically a programmable phase shifter PS according to the invention. Such a programmable phase shifter has a first input which is intended to receive an input signal Vin to be phase-shifted, for example of the form A.cos ωt, a second input intended to receive a digital control signal CM[0:2N−1] and an output intended to supply an output signal Vout having the form A'.cos (ωt−X) in this example, and thus, with respect to the input signal, a phase shift having a value X which is defined by the control signal CM[0:2N−1]. This programmable phase shifter PS comprises:

- a quadratic module 10 having an input which is connected to the first input of the programmable phase shifter PS and an output intended to supply a signal which is in phase quadrature with the input signal Vin, i.e. of the form A.sin ωt in this example,
- a first multiplier 20 and a second multiplier 30 each having a first and a second input and an output, the first input of the first multiplier 20 being connected to the first input of the programmable phase shifter PS, the first input of the second multiplier 30 being connected to the output of the quadratic module 10, the output of the first multiplier 20 being intended to supply a signal resulting from the multiplication of the signal Vin, of the form A.cos ωt, received at its first input by a value which is substantially equal to V.cos (X), in which V is a DC voltage, the output of the second multiplier 30 being intended to supply a signal resulting from the multiplication of the signal, of the form A.sin ωt, received at its first input by a value which is substantially equal to V.sin (X), the values of V.cos (X) and V.sin (X) being defined by signals elaborated on the basis of the control signal CM[0:2N−1] and received by the multipliers 20 and 30 at their second inputs,
- an adder 40 having a first input connected to the output of the first multiplier 20, a second input connected to the output of the second multiplier 30 and intended to supply, at an output connected to the output of the programmable phase shifter PS, a signal Vout of the form A'.cos (ωt−X) resulting from the sum of the signals received at its first and second inputs.

The control signal CM[0:2N−1] is constituted by a first control word C[0:N−1] defining a value which is substantially equal to V.cos (X), and a second control word S[0:N−1] defining a value which is substantially equal to V.sin (X). The second input of each multiplier 20 and 30 is of a digital type and each multiplier 20 and 30 is provided with means for effecting a digital multiplication of the signal received at its first input by the signal received at its second input, the second input of each multiplier being intended to receive one of the control words C[0:N−1] or S[0:N−1].

Figure 2:
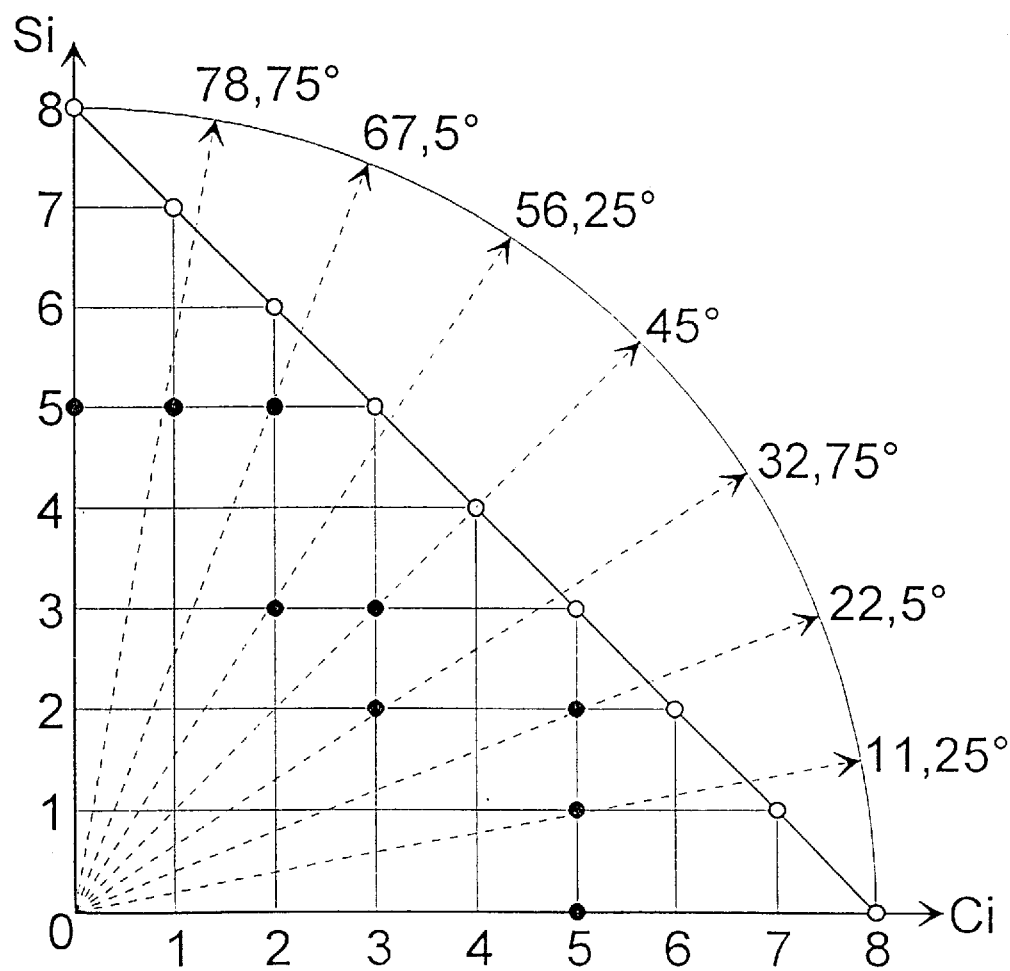
FIG. 2 is a Fresnel diagram showing a range of phase shifts obtained by means of different digital values of the control words.

FIG. 2 is a Fresnel diagram on the basis of which the digital values Si and Ci of the control words S[0:N−1] and C[0:N−1] can be derived as a function of the desired phase shift X and the coding of the contents of the control words. The phase shift X obtained at the output of the programmable phase shifter is expressed in degrees. X has been chosen to be developed in steps of 11.25°, with which a total number of 32 different values of X can be obtained. Only the cases where the phase shift X is between 0° and 90° have been shown, whereas the cases where X is between 90° and 360° can easily be extrapolated from this figure because of the parity of the cosine functions and the imparity of the sine functions. The white circles represent pairs of values (Ci,Si) in the case where they develop from 0 to 8. The black circles represent pairs of integral values (Ci,Si) in the case where they develop from 0 to 5. In the first-mentioned case, the pair (Ci,Si) which is best adapted to obtain a phase shift of a value X near 22.5° is, for example (6,2). In the second case, the pair which is best adapted to obtain a phase shift of the same order is (5.2). The errors introduced in these approximations are small and not very much subject to variation since they are the result of a digital approximation. They are substantially equivalent from one case to the other.

Figure 3:
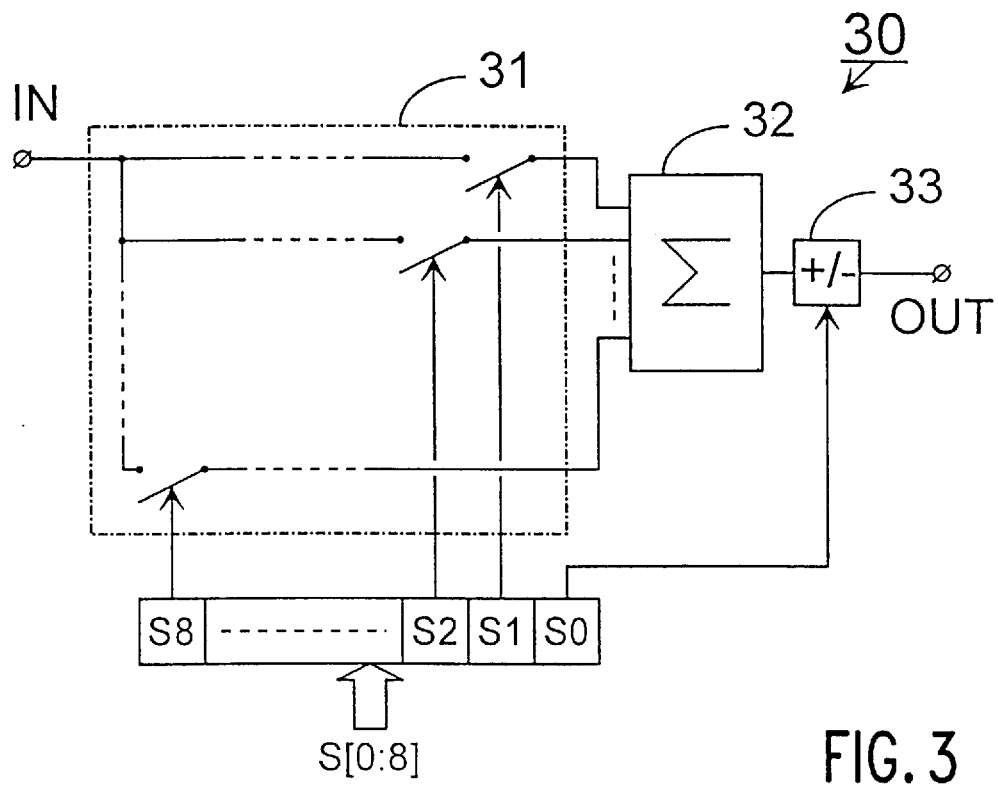
FIG. 3 is a diagram partly showing a multiplier in a programmable phase shifter in accordance with an embodiment of the invention.

FIG. 3 shows diagrammatically a multiplier 30 which is present in a programmable phase shifter PS in accordance with an embodiment of the invention, in the case where the format of each control word is 9 bits (N=9). Such a multiplier comprises:

a switching stage 31 composed of 8 switches each having a first and a second terminal and a control input for controlling the switching, the first terminal of each switch being connected to the first input IN of the multiplier 30, the 8 control inputs receiving 8 bits S1, S2, . . . S8 from the second input of the multiplier 30, an adder 32 having an output and 8 inputs, each being connected to the second terminal of one of the 8 switches of the switching stage 31, and an inversion module 33 having a first input connected to the output of the adder 32, a control input receiving the bit S0 from the second input of the multiplier, which bit S0, referred to as sign bit, does not control any switch of the switching stage 31, and an output constituting the output OUT of the multiplier 30, the inversion module 33 being intended to operate the inversion of the sign of a signal received at its first input if the sign bit S0 is in an active state, and to function as a follower if the sign bit is in inactive state.

The structure of the multiplier 20 is identical to that of the multiplier 30. The digital value of the contents of each control word corresponds to the total number of bits among S1, S2, . . . S8, which are at an active level and thus allow the switches to be rendered conducting. If one wishes to obtain a phase shift X of 22.5°, (Ci,Si)=(6,2) in FIG. 2. Considering that the sign bit is at the inactive level when it becomes 0, this condition is validated by choosing, for example, a value 000000110 for Ci and a value 111111000 for Si. This coding is advantageous because the values of the control words are mutually complementary, with the exception of the sign bits. The elaboration of the control signal will thus be simplified.

Figure 4:
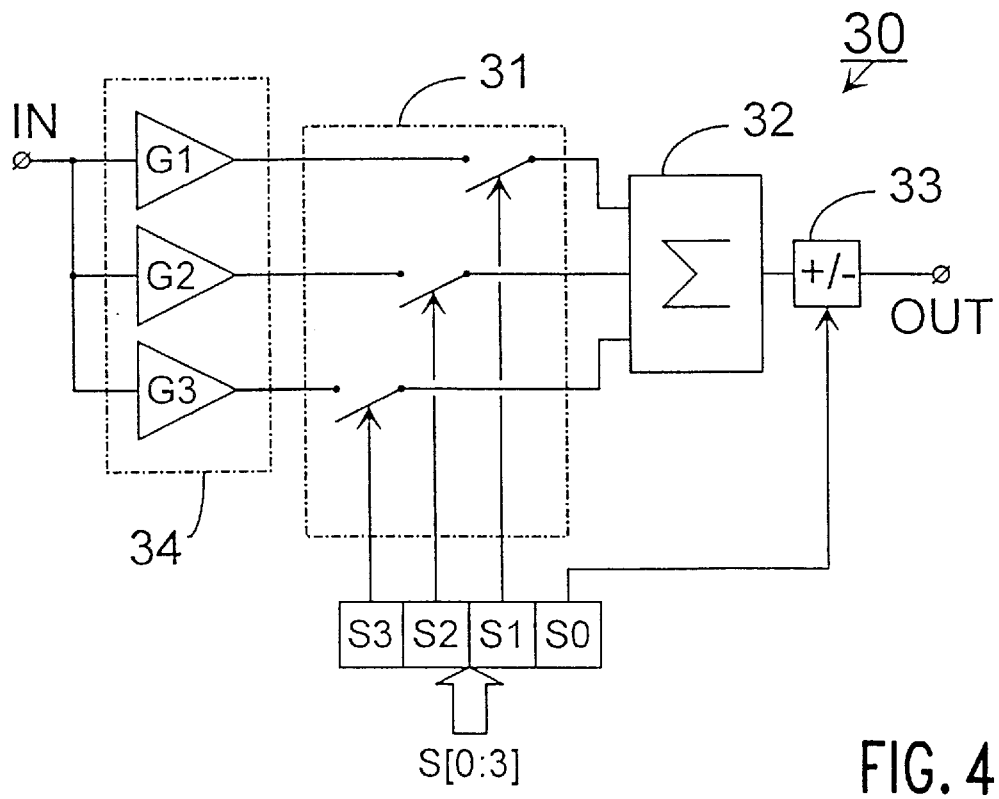
FIG. 4 is a diagram partly showing a multiplier in a programmable phase shifter in accordance with a preferred embodiment of the invention.

FIG. 4 shows diagrammatically a multiplier 30 which is present in a programmable phase shifter PS in accordance with a preferred embodiment of the invention, in the case where the format of each control word is reduced to 4 bits (N=4) without affecting the precision of the phase shift obtained. The multiplier 30 shown in FIG. 4 comprises a switching stage 31 which is composed of three switches controlled by three bits S1, S2, S3 originating from the second input of the multiplier 30 which receives a signal S[0:3]. The multiplier 30 also comprises an adder 32 having one output and 3 inputs and an inversion module 33 controlled by the sign bit S0, whose first input of which is connected to the output of the adder 32, and whose output constitutes the output OUT of the multiplier 30. An amplifier stage 34 composed of 3 amplifiers is inserted within the multiplier 30, each amplifier having an input which is connected to the first input IN of the multiplier 30, and an output, whose activation and deactivation are controlled by means of one of the 3 switches of the switching stage 31, connected to one of the 3 inputs of the adder 32. The gain Gi of the $i^{th}$ amplifier (for i=1 to 3) is equal to K times the weight, within the control word from which it originates, of the bit controlling the switch which controls the activation or deactivation of the output of said $i^{th}$ amplifier.

The structure of the multiplier 20 is identical to that of multiplier 30. FIG. 2 shows that, for obtaining a phase shift X of 22.5°, and with the hypothesis that the values of Ci and Si are less than or equal to 5, the pair (Ci,Si)=(5,2) is suitable. By attributing the weight 1, for example, to the bits C1 and S1 of the control words C[0:N−1] and S[0:N−1], the weight 2 to the bits C2 and S2 and also the weight 2 to the bits C3 and S3, which is realized by constructing the amplifiers of the amplifier stage in such a way that G1=K, G2=2.K and G3=2.K, the condition (Ci,Si)=(5,2) is realized by choosing, for example, a value 1110 for Ci and a value 0100 for Si. The total structure of the programmable phase shifter is thus simplified because of the reduction of the complexity of the multipliers, on the one hand, and because of the reduction of the format of the control signal, on the other hand.

Figure 5:
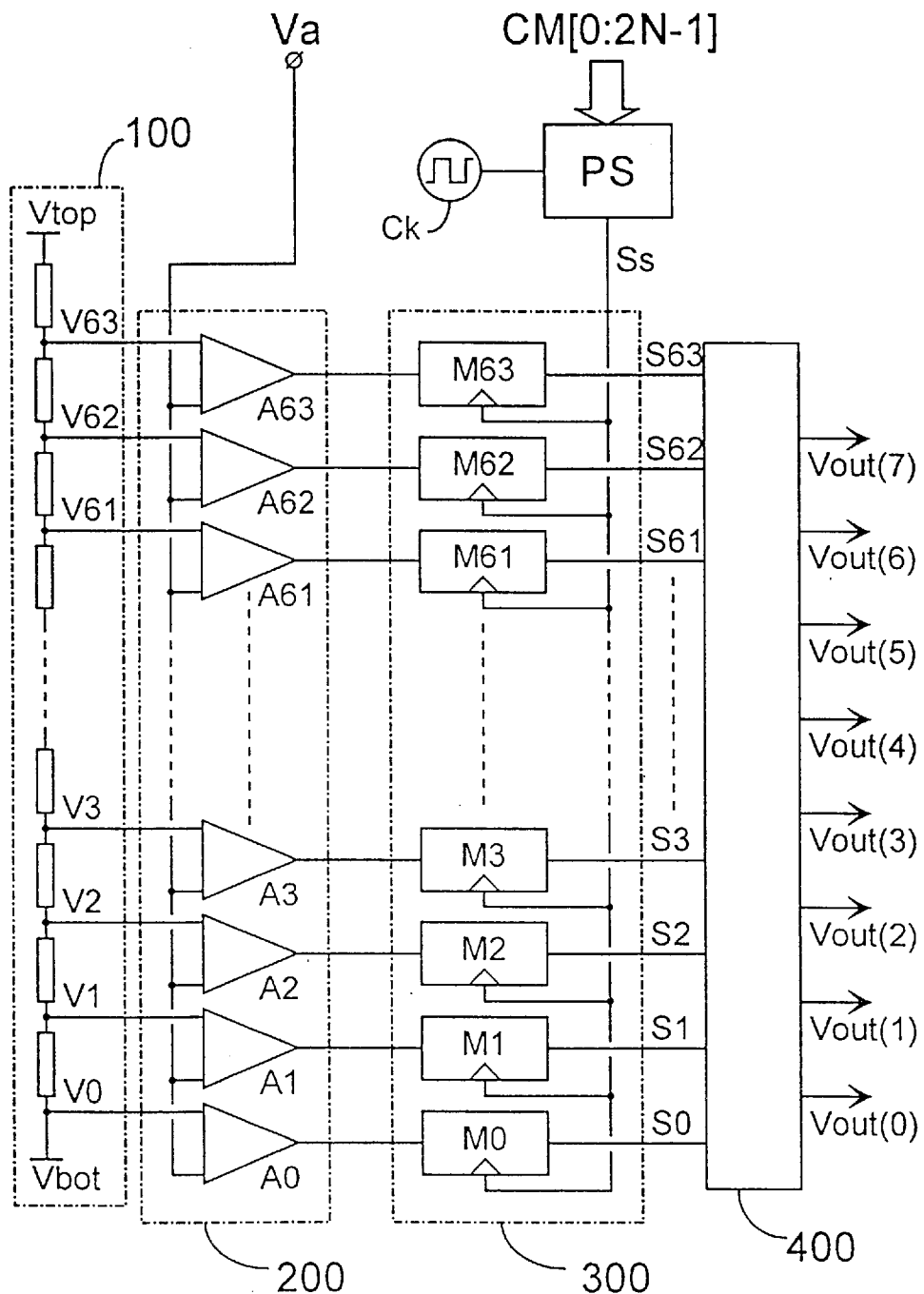
FIG. 5 is a partial diagram of an A/D converter using a programmable phase shifter according to the invention.

FIG. 5 partly shows an A/D converter which is used in a programmable phase shifter PS according to the invention. This A/D converter, intended to receive an analog input voltage Va to be converted into a digital output signal, coded at 8 bits in this example, Vout[0:7], comprises:

a resistance ladder 100 arranged in series between two power supply terminals, Vbot and Vtop, which resistances are intended to furnish a plurality of reference voltages V0, V1, . . . V63 at their junction points, . a comparison stage 200 composed of comparators A0, A1, . . . A63, each having two inputs and one output and being intended to receive the analog input voltage Va at one input and one of the reference voltages V0, V1, . . . V63 at the other input, a memory stage 300 composed of flipflops M0, M1, . . . M63, each connected to the output of one of the comparators A0, A1, . . . A63 for storing the result of a comparison, and receiving a sampling signal Ss at a clock input, and a binary encoder 400 connected to the memory stage 300 for receiving the stored data and furnishing the digital output signal Vout[0:7] of the converter.

The converter also comprises a programmable phase shifter PS as described above, receiving a clock signal Ck having a fixed frequency at its first input, a digital control signal CM[0:2N−1] at its second input, and supplying the sampling signal Ss at the output, which signal, with respect to the clock signal Ck, has a phase shift X whose value is defined by the control signal CM[0:2N−1].

When this converter is used in A/D conversions of high-frequency video signals, the programmable phase shifter allows, by way of an appropriate choice of the value of X, a shift of the active edge of the sampling signal Ss on a reference threshold of the input signal Va, such that the sampling of said reference threshold is effected under optimal conditions.

I claim:

1. A programmable phase shifter having a first input intended to receive an input signal to be phase-shifted, a second input intended to receive a digital control signal, and an output intended to supply an output signal which, with respect to the input signal, has a phase shift of which a value X is defined by the control signal, said programmable phase shifter comprising:

- a quadratic module having an input which is connected to the first input of the programmable phase shifter, and an output intended to supply a signal which is in phase quadrature with the input signal,
- a first and a second multiplier each having a first and a second input and an output, the first input of the first multiplier being connected to the first input of the programmable phase shifter, the first input of the second multiplier being connected to the output of the quadratic module, the output of the first multiplier being intended to supply a signal resulting from the multiplication of the signal received at its first input by a value which is substantially equal to V.cos (X), in which V represents a DC voltage, the output of the second multiplier being intended to supply a signal resulting from the multiplication of the signal received at its first input by a value which is substantially equal to V.sin (X), the values V.cos (X) and V.sin (X) being defined by signals elaborated on the basis of the control signal and received by the multipliers at their second input,
- an adder having a first input which is connected to the output of the first multiplier, a second input which is connected to the output of the second multiplier and intended to supply, at an output connected to the output of the programmable phase shifter, a signal resulting from the sum of the signals received at its first and second inputs,
- characterized in that, the control signal being constituted by a first control word defining a value which is substantially equal to V.cos (X) and a second control word defining a value which is substantially equal to V.sin (X), the second input of each multiplier is of a digital type and intended to receive one of the control words, and each multiplier is provided with means for multiplying the signal received at its first input by the signal received at its second input.

2. A programmable phase shifter as claimed in claim 1, characterized in that the multipliers are digital multipliers.

3. A programmable phase shifter as claimed in claim 2, characterized in that, the format of the control words being N bits, each multiplier comprises:

- a switching stage composed of N−1 switches each having a first and a second terminal and a control input for controlling the switching operation, the first terminal of each switch being connected to the first input of the multiplier, the N−1 control inputs receiving N−1 bits from the second input of the multiplier,
- an adder having an output and N−1 inputs, each being connected to the second terminal of one of the N−1 switches of the switching stage, and
- an inversion module having a first input connected to the output of the adder, a control input receiving that bit, referred to as sign bit, from the second input of the multiplier which does not control any switch of the switching stage, and an output constituting the output of the multiplier, said inversion module being intended to operate the inversion of the sign of a signal received at its first input if the sign bit is in an active state, and to function as a follower if the sign bit is in an inactive state.

4. A programmable phase shifter as claimed in claim 3, characterized in that an amplifier stage composed of N−1 amplifiers is inserted within each multiplier, each amplifier having an input which is connected to the first input of the multiplier, and an output whose activation and deactivation are controlled by means of one of the N−1 switches of the switching stage, connected to one of the inputs of the adder, the gain Gi of the $i^{th}$ amplifier (for i=1 to N−1) being equal to K times the weight, within the control word from which it originates, of the bit controlling the switch which controls the activation or deactivation of the output of said $i^{th}$ amplifier.

5. An A/D converter intended to receive an analog input voltage to be converted into a digital output signal, comprising:

- a resistance ladder arranged in series between two power supply terminals, which resistances are intended to supply a plurality of reference voltages at their junction points,
- a comparison stage composed of comparators, each having two inputs and one output and being intended to receive the analog input voltage at one input and one of the reference voltages at the other input,
- a memory stage composed of flipflops, each being connected to the output of one of the comparators for storing the result of a comparison, and intended to receive a sampling signal at a clock input,
- a binary encoder connected to the memory stage for receiving the stored data and for furnishing the digital output signal of the converter,
- characterized in that the converter also comprises a programmable phase shifter as claimed in claim 1, intended to receive a clock signal having a fixed frequency at its first input, a digital control signal at its second input, and to deliver the sampling signal at its output, which sampling signal, with respect to the clock signal, has a phase shift whose value is defined by the control signal.

\* \* \* \* \*